United States Patent
Urabe et al.

(10) Patent No.: US 10,326,271 B2
(45) Date of Patent: Jun. 18, 2019

(54) SOLAR POWER GENERATION SYSTEM

(71) Applicants: TOYOTA JIDOSHA KABUSHIKI KAISHA, Toyota-shi, Aichi-ken (JP); TOKYO METROPOLITAN UNIVERSITY, Shinjuku-ku, Tokyo (JP)

(72) Inventors: Shinichi Urabe, Shizuoka-ken (JP); Toshihisa Shimizu, Fuchu (JP)

(73) Assignees: TOYOTA JIDOSHA KABUSHIKI KAISHA, Toyota-shi, Aichi-ken (JP); TOKYO METROPOLITAN UNIVERSITY, Shinjuku-ku, Tokyo (JP)

( * ) Notice: Subject to any disclaimer, the term of this patent is extended or adjusted under 35 U.S.C. 154(b) by 0 days.

(21) Appl. No.: 15/630,339

(22) Filed: Jun. 22, 2017

(65) Prior Publication Data
US 2017/0373497 A1    Dec. 28, 2017

(30) Foreign Application Priority Data

Jun. 23, 2016    (JP) .................................. 2016-124892

(51) Int. Cl.
*H02S 50/00* (2014.01)
*H02S 50/10* (2014.01)
(Continued)

(52) U.S. Cl.
CPC .............. *H02J 1/06* (2013.01); *H01L 31/053* (2014.12); *H01L 31/0504* (2013.01);
(Continued)

(58) Field of Classification Search
CPC ... H02J 1/06; H02J 3/383; H02J 3/385; H02S 50/00; H02S 40/30; H02S 40/36;
(Continued)

(56) References Cited

U.S. PATENT DOCUMENTS

| | | | | |
|---|---|---|---|---|
| 2008/0236648 A1* | 10/2008 | Klein | ................ | H01L 31/02021 136/244 |
| 2013/0106194 A1* | 5/2013 | Jergovic | .............. | H01L 31/0504 307/77 |
| 2015/0114449 A1* | 4/2015 | Yun | ........................... | G05F 1/67 136/244 |

FOREIGN PATENT DOCUMENTS

| | | |
|---|---|---|
| CN | 105226939 A | 1/2016 |
| JP | 2015-162094 A | 9/2015 |
| JP | 2016-214061 A | 12/2016 |

OTHER PUBLICATIONS

Toshihisa Shimizu: "Generation Control Circuitry for Operating Point Normalization of Photovoltaic Modules", on pp. 22-27 of FB Technical News No. 56, Nov. 1, 2000.
(Continued)

*Primary Examiner* — Rexford N Barnie
*Assistant Examiner* — Terrence R Willoughby
(74) *Attorney, Agent, or Firm* — Sughrue Mion, PLLC

(57) ABSTRACT

A solar power generation system includes: solar cells, or solar cells and at least one capacitor, connected in series between output terminals; an accompanying circuit provided for each of the solar cells, or each of the solar cells and each of the at least one capacitor, the accompanying circuit including an inductor and a switching device arranged in series; and a power generation operating point control device. The solar cells, or the solar cells and the at least one capacitor, are divided into units, of which adjacent units share one of the solar cells or one of the at least one capacitor. The power generation operating point control device is provided for each of the units, and is configured to control connection and disconnection of the switching device so as to optimize power generating capacity of the unit for which the power generation operating point control device is provided.

6 Claims, 2 Drawing Sheets

(51) Int. Cl.
*H01L 31/053* (2014.01)
*H02J 1/06* (2006.01)
*H01L 31/05* (2014.01)
*H02S 40/30* (2014.01)

(52) U.S. Cl.
CPC .............. *H02S 40/30* (2014.12); *H02S 50/00* (2013.01); *H02S 50/10* (2014.12)

(58) Field of Classification Search
CPC ... H02S 50/10; H01L 31/0504; H01L 31/053; H01L 31/04; H01L 31/042–31/044; H01L 31/05
See application file for complete search history.

(56) References Cited

OTHER PUBLICATIONS

Toshihisa Shimizu et al.: "Improvement of the Efficiency Characteristics on the Photovoltaic Generation System based on a Generation Control Circuit" (Proceedings of JSES/JWEA Joint Conference (1996)[Oct. 31-Nov. 1, 1996] pp. 57-60.

* cited by examiner

SOLAR POWER GENERATION SYSTEM

INCORPORATION BY REFERENCE

The disclosure of Japanese Patent Application No. 2016-124892 filed on Jun. 23, 2016 including the specification, drawings and abstract is incorporated herein by reference in its entirety.

BACKGROUND

1. Technical Field

The present disclosure relates to a solar power generation system.

2. Description of Related Art

A solar cell has a characteristic that current gradually decreases in accordance with increase of voltage until the voltage between its terminals reaches a certain level, but the current rapidly decreases if the voltage increases further than that level. Therefore, the output (electric power) of the solar cell assumes an inverted V-shaped pattern, namely, increases substantially uniformly as the voltage between the terminals increases, and rapidly decreases after it reaches a peak value. Also, the peak point of the output (power) of the solar cell shifts in such a direction that voltage and current are reduced as the intensity of sunlight irradiation is reduced. Therefore, it is necessary to appropriately control the voltage between the terminals, so as to operate the solar cell at the maximum output point. In a solar power generation system in which a plurality of solar cells are connected in series, the output of the system is the sum of the outputs of the respective solar cells; therefore, in order to maximize the output of the solar power generation system while keeping the voltage between the output terminals as constant as possible, during a process in which the power generating capacity of each solar cell varies individually, it is effective to optimally control the output sharing ratio of each of the solar cells connected in series. A control device that performs the optimization control is described as "Generation Control Circuitry for Operating Point Normalization of Photovoltaic Modules", on pages 22-27 of FB Technical News No. 56, Nov. 1, 2000, written by Toshihisa SHIMIZU.

SUMMARY

When a means, such as the power generation operating point control circuit as described above, for optimally controlling the output sharing ratio of each solar cell, is incorporated in a solar power generation system in which a plurality of solar cells are connected in series, the time required to search for its optimum operating point significantly increases as the number "n" of the solar cells connected in series increases, since the search is conducted in two directions (increasing and decreasing directions), and the number of times of searching is equal to the "n"-th power of 2k, where k denotes the number of times of searching in each direction, and "n" denotes the number of the solar cells. As a result, it takes time to reach the optimum operating point, and search control may not be properly carried out so as to follow variation in the quantity of light received by each solar cell.

This disclosure provides a solar power generation system that does not increase time required to search for an optimum operating point of each solar cell even if the number of solar cells that are connected in series is increased.

A solar power generation system according to an aspect of the disclosure includes: a plurality of solar cells, or a plurality of solar cells and at least one capacitor, which are connected in series between output terminals; an accompanying circuit provided for each of the plurality of solar cells, or each of the plurality of solar cells and each of the at least one capacitor, the accompanying circuit including an inductor and a switching device arranged in series; and a power generation operating point control device. Each of the plurality of solar cells or each of the solar cells and each of the at least one capacitor is operable to deliver current to between the output terminals when corresponding switching device is cut off. The plurality of solar cells, or the plurality of solar cells and the at least one capacitor, are divided into a plurality of units, of which adjacent units share one of the plurality of solar cells or one of the at least one capacitor. The power generation operating point control device is provided for each of the plurality of units, and is configured to control connection and disconnection of the switching device that belongs to the unit for which the power generation operating point control device is provided so as to optimize power generating capacity of the unit for which the power generation operating point control device is provided.

According to the above aspect, the optimization control for optimizing the power generation operating point of the solar cell is performed on a series of solar cells or solar cells and a capacitor(s) in each unit; therefore, the time it takes the solar cells or the solar cells and the capacitor(s) of each unit to reach the optimum operating point is significantly shortened. If each unit is optimally controlled in this manner, operation of the solar power generation system having a series of the units is also optimized. Also, if one of the solar cells and the capacitors is shared by two units located adjacent to each other, the output sharing ratio or the voltage sharing ratio can be optimally allocated between these two units, by allocating the output sharing ratio or voltage sharing ratio of the solar cell or capacitor thus shared, between the two units. In the case where a capacitor, which replaces a part of the solar cells, is connected in series between the output terminals, the capacitor, which is cheaper than a solar cell, makes up for voltage that would be otherwise provided by a solar cell, and the solar power generation system of a given voltage can be realized by a reduced number of solar cells.

In the above aspect, the solar power generation system may include a control device that comprehensively optimizes operation of the power generation operating point control device for each of the plurality of units.

According to the above configuration, it is possible to optimize operation of the solar power generation system as a whole, while controlling operation of each unit as optimally as possible.

In the above aspect, the solar power generation system may include an electric power meter that detects an output of each of the plurality of units.

According to the above configuration, it is possible to optimize operation of each unit as described above, while checking power generating capacity in each unit.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
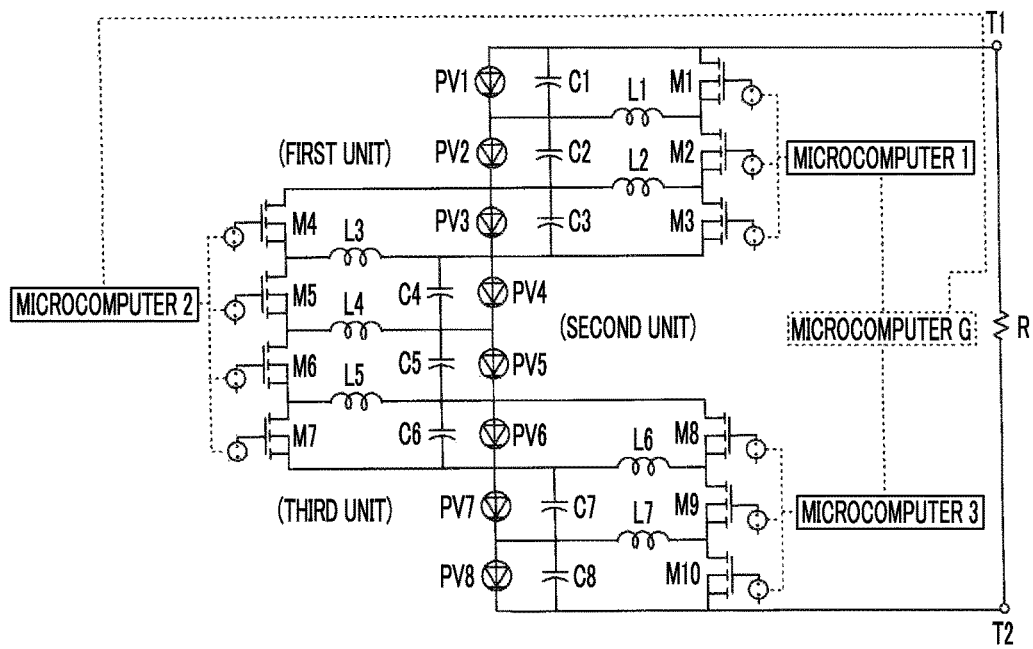
FIG. 1 is a circuit diagram showing a solar power generation system as first embodiment of the disclosure.

A solar power generation system according to a first embodiment is shown in FIG. 1. In the solar power generation system shown in FIG. 1, eight solar cells PV1-PV8 are connected in series. Out of these solar cells PV1-PV8, solar cells PV1-PV3 constitute a first unit, and solar cells PV3-PV6 constitute a second unit, while solar cells PV6-PV8 constitute a third unit. The first, second and third units are individually subjected to power generation operating point optimization control performed by corresponding microcomputers 1, 2, 3. The solar cell PV3 is shared by the first unit and the second unit that are located adjacent to each other, and the solar cell PV6 is shared by the second unit and the third unit that are located adjacent to each other. A circuit including an inductor L1-L7 and a switching device M1-M10, such as a MOSFET, which are connected in series, is formed with respect to each of the solar cells PV1-PV8, and the switching devices M1-M10 selectively pass electric current or cut off current between opposite terminals of the corresponding solar cells PV1-PV8, via the inductors L1-L7. In this case, a circuit including each solar cell, inductor, and a switching device connected in series constitute a known boost chopper circuit, and operates to deliver current as output when the switching device is cut off. A capacitor C1-C8 is connected in parallel with each of the solar cells PV1-PV8. The opposite ends of the solar cells PV1-PV8 connected in series are output terminals T1, T2 of the solar power generation system, and a load R is connected between the output terminals T1, T2. The microcomputers 1, 2, 3 may be placed under control of a microcomputer G that comprehensively controls the solar power generation system.

In operation of the solar power generation system, the microcomputers 1, 2, 3 sequentially control the output sharing ratio of each of the solar cells in each unit, and optimize the output of each unit in accordance with variation in sunlight irradiation onto each solar cell with time. At this time, the output sharing ratio of each of the solar cells PV3 and PV6 shared by the adjacent units is divided into two portions corresponding to operation in the two units; therefore, the relative output sharing ratios of the two units can be optimized, through adjustment of allocation of the output sharing ratio of the solar cell shared by the two units.

Figure 2:
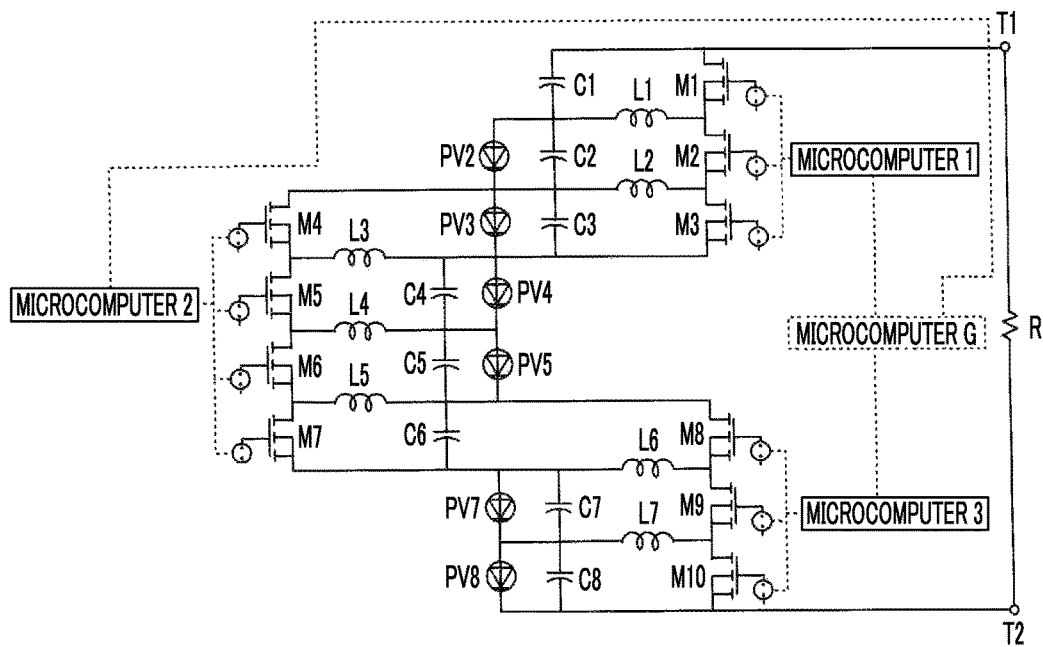
FIG. 2 is a circuit diagram showing a solar power generation system as second embodiment of the disclosure.

A solar power generation system according to a second embodiment is shown in FIG. 2. The solar power generation system shown in FIG. 2 has substantially the same structure as the solar power generation system shown in FIG. 1, except that the solar cells PV1, PV6 are eliminated in the system of FIG. 2. The other constituent elements are the same as those of the system shown in FIG. 1. While a capacitor in this type of circuit normally has a function of curbing or moderating voltage fluctuations, the capacitors C1, C6 located at positions corresponding to the solar cells PV1, PV6 thus eliminated in this example operate to deliver stored charge to between the output terminals T1, T2 when the corresponding switching devices M1, M6 are cut off, so that each of the capacitors C1, C6 bears the voltage sharing ratio when the power generation point of the unit to which the capacitor belongs is optimized, under power generation operating point optimization control of each unit. Details of the solar power generation system including the capacitors having this function are described in Japanese Patent Application No. 2016-083307 previously filed by the same applicant as that of this application. Under the power generation operating point optimization control of each unit, the output sharing ratio or voltage sharing ratio is allocated to each of the solar cell PV3 and the capacitor C6 shared by the adjacent units, by means of the corresponding switching device M3 or M4 or the switching device M7 or M8, so that the solar cell PV3 and the capacitor C6 operate to maintain the voltage, in place of the solar cells PV1 and PV6. The operation of the solar power generation system of FIG. 2 as described above is substantially the same as that of the solar power generation system of FIG. 1.

Figure 3:
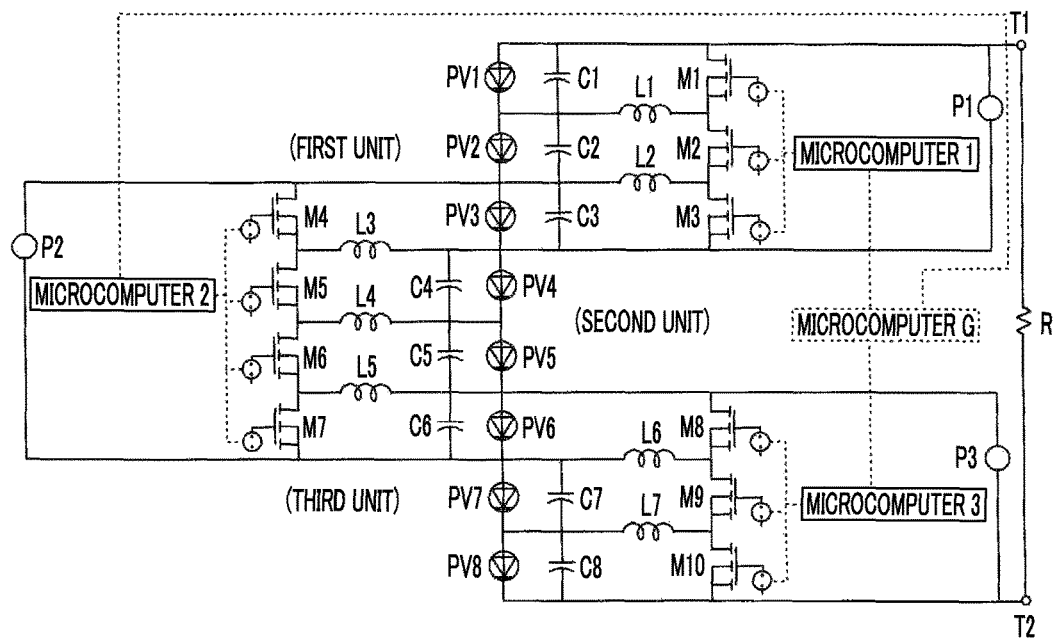
FIG. 3 is a circuit diagram showing a solar power generation system provided by adding an electric power meter that measures the output of each unit to the solar power generation system shown in FIG. 1.

A modification of the first embodiment is shown in FIG. 3. A solar power generation system shown in FIG. 3 has a structure in which electric power meters P1, P2, P3 for measuring the output of each unit are added to the solar power generation system shown in FIG. 1. The other constituent elements are the same as those of the solar power generation system of FIG. 1. With the power meters P1, P2, P3 thus added, when a large difference arises in the intensity of sunlight irradiation among the first to third units, in particular, the output sharing among the units can be adjusted, and the solar power generation system can be operated with improved stability.

Figure 4:
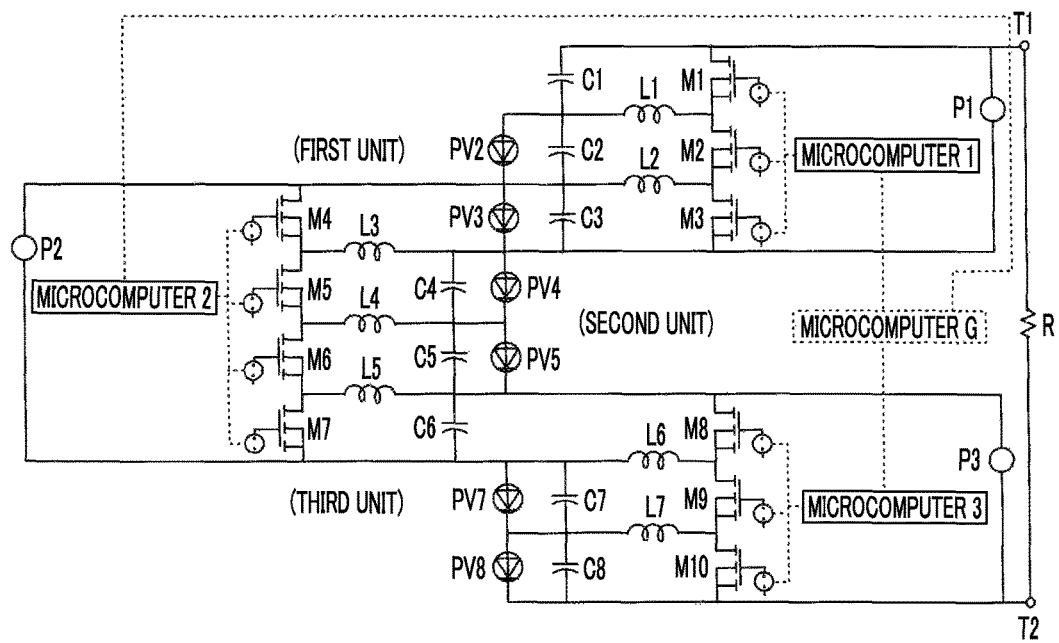
FIG. 4 is a circuit diagram showing a solar power generation system provided by adding an electric power meter that measures the output of each unit to the solar power generation system shown in FIG. 2.

A modification of the second embodiment is shown in FIG. 4. A solar power generation system shown in FIG. 4 has a structure in which electric power meters P1, P2, P3 for measuring the output of each unit are added to the solar power generation system shown in FIG. 2. The other constituent elements are the same as those of the solar power generation system of FIG. 2. In this case, too, the addition of the power meters P1, P2, P3 makes it possible to adjust the output sharing among the units when a difference arises in the intensity of sunlight irradiation among the first to third units, in particular, and operate the solar power generation system with improved stability.

While some embodiments of the disclosure have been described above in detail, it would be apparent to those skilled in the art that various changes can be made in these embodiments, within the scope of the principle of this disclosure.

What is claimed is:

1. A solar power generation system comprising:
   a plurality of solar cells, or a plurality of solar cells and at least one capacitor, which are connected in series between output terminals, wherein the plurality of solar cells, or the plurality of solar cells and the at least one capacitor, are divided into a plurality of units;
   a plurality of accompanying circuits, wherein each accompanying circuit of the plurality of accompanying circuits is respectively provided for each of the plurality of solar cells, or respectively provided for each of the plurality of solar cells and each of the at least one capacitor, each accompanying circuit including an inductor and a first switching device arranged in series; and a plurality of power generation operating point control devices, wherein each power generation operating point control device of the plurality of power generation operating point control devices is respectively provided for each unit of the plurality of units, each power generation operating point control device configured to control each first switching device provided for the unit for which the power generation operating point control device is provided, wherein at least one accompanying circuit of the plurality of accompanying circuits is a shared accompanying circuit, provided for a first unit of the plurality of units that is adjacent to a second unit of the plurality of units, the shared accompanying circuit further comprising a second switching device, the power generation operation point control device provided for the second unit is configured to control the second switching device of the shared accompanying circuit, and the power generation operation point control device provided for the first unit is configured to control the first switching device of the shared accompanying circuit, each of the plurality of solar cells or, each of the plurality of solar cells and each of the at least one capacitor, is operable to deliver current to between the output terminals when a corresponding switching device is cut off, and each power generation operating point control device of the plurality of power generation operating point control devices is configured to control connection and disconnection of each first switching device and each second switching device that is provided for the unit for which the power generation operating point control device is provided so as to optimize power generating capacity of the unit for which the power generation operating point control device is provided.

2. The solar power generation system according to claim 1, further comprising
a control device that comprehensively optimizes operation of each power generation operating point control device in the plurality of power generation operating point control devices.

3. The solar power generation system according to claim 1, further comprising
an electric power meter that detects an output of each of the plurality of units.

4. The solar power generation system according to claim 1, wherein
each of the plurality of units includes solar cells of the plurality of solar cells as a row of solar cells, and at least one solar cell of the row of solar cells, at an intermediate position of the row of solar cells, is connected in parallel with each first switching device that is included in each accompanying circuit provided for the row of solar cells, through at least one of the inductors included in the accompanying circuits provided for the row of solar cells, and
the first switching devices that are included in the accompanying circuits provided for the row of solar cells are connected in series.

5. The solar power generation system according to claim 4, wherein
for the row of solar cells of the first unit:
one solar cell of the row of solar cells is located at a first end of the first unit that is closer to a first output terminal of the output terminals of the solar power generation system than a second end of the first unit,
another solar cell of the row of solar cells is located at the second end of the first unit, the second end of the first unit being closer to a second output terminal of the output terminals of the solar power generation system than the first end of the first unit, and the accompanying circuit provided for the one solar cell is the shared accompanying circuit that comprises the second switching device,
a first line connects a side of the one solar cell to the first switching device that is included in the accompanying circuit provided for the one solar cell without passing through the inductor included in the accompanying circuit provided for the one solar cell, and
a second line connects a side of the another solar cell to the second switching device that is included in the shared accompanying circuit provided for the another solar cell without passing through the inductor included in the shared accompanying circuit provided for the another solar cell.

6. The solar power generation system according to claim 1, wherein
each unit of the plurality of units includes at least one capacitor connected in parallel with at least one of the solar cells of the unit.

* * * * *